(12) United States Patent
Tsuneda et al.

(10) Patent No.: US 6,682,971 B2
(45) Date of Patent: Jan. 27, 2004

(54) METHOD OF MANUFACTURING A SEMICONDUCTOR

(75) Inventors: Masayuki Tsuneda, Tokyo (JP); Hideharu Itatani, Tokyo (JP)

(73) Assignees: Hitachi Kokusai Electric Inc., Tokyo (JP); Hitachi, Ltd., Tokyo (JP)

( * ) Notice: Subject to any disclaimer, the term of this patent is extended or adjusted under 35 U.S.C. 154(b) by 98 days.

(21) Appl. No.: 09/820,194

(22) Filed: Mar. 29, 2001

(65) Prior Publication Data

US 2001/0039115 A1 Nov. 8, 2001

(30) Foreign Application Priority Data

Mar. 30, 2000 (JP) ......................... 2000-094119
Mar. 6, 2001 (JP) ......................... 2001-061124

(51) Int. Cl.[7] ......................... H01L 21/8242
(52) U.S. Cl. ................. 438/240; 438/253; 438/393
(58) Field of Search ................. 438/778, 393, 438/240, 253

(56) References Cited

FOREIGN PATENT DOCUMENTS

JP 6-283438 10/1994

OTHER PUBLICATIONS

U.S. patent application Publication US 2001/0055890 A1; Hartner et al.*

* cited by examiner

Primary Examiner—George Fourson
Assistant Examiner—Fernando Toledo
(74) Attorney, Agent, or Firm—McGinn & Gibb, PLLC

(57) ABSTRACT

A semiconductor manufacturing method and a semiconductor manufacturing apparatus capable of manufacturing semiconductor devices without the need of specifically determining an optimal configuration of a gas mixing chamber (6) with care or elaboration. A ruthenium raw gas feed pipe (4) and an oxygen-containing gas feed pipe (5) are merged with each other at a location upstream of a gas mixing chamber (6), so that the ruthenium raw gas and the gas containing oxygen atoms (e.g., oxygen ($O_2$), ozone ($O_3$), etc.) are mixed with each other prior to entering the gas mixing chamber (6).

7 Claims, 8 Drawing Sheets

METHOD OF MANUFACTURING A SEMICONDUCTOR

BACKGROUND OF THE INVENTION

1. Field of the Invention

The present invention relates to a method and apparatus for manufacturing semiconductor devices in which ruthenium films or ruthenium oxide films are formed on a substrate.

2. Description of the Related Art

For such a method of forming thin films of ruthenium or ruthenium oxide on a substrate, there has been known a typical example in which a ruthenium raw gas and a gas containing oxygen atoms such as, for example, oxygen ($O_2$), ozone ($O_3$), etc.) are reacted with each other in their vapor or gaseous phase inside a reaction chamber with a substrate received therein.

FIG. 5 is a view for explaining one example of a conventional semiconductor manufacturing apparatuses using such a method. The semiconductor manufacturing apparatus illustrated in FIG. 5 includes a reaction chamber 1, a container or vessel 2 containing a ruthenium liquid material, a vaporizer 3 for vaporizing the ruthenium liquid material, a ruthenium raw gas feed pipe 4 for feeding a vaporized ruthenium raw gas to the reaction chamber 1, an oxygen-containing gas feed pipe 5 for feeding an oxygen-containing gas such as, for example, a gas containing oxygen atoms (e.g., oxygen ($O_2$), ozone ($O_3$), etc.) to the reaction chamber 1, a gas mixing chamber 6, and a carrier gas pipe 11 and an exhaust pipe 22.

In the reaction chamber 1, there are provided a substrate holder 8 with an unillustrated heating source or heater for supporting a substrate 7 thereon, and a nozzle or shower head 9 for jetting or spraying a mixture of the ruthenium raw gas and the oxygen-containing gas containing oxygen atoms (e.g., oxygen ($O_2$), ozone ($O_3$), etc.) in a shower-like manner.

The gas mixing chamber 6 is arranged between the reaction chamber 1 and the ruthenium raw gas feed pipe 4, and between the reaction chamber 1 and the oxygen-containing gas feed pipe 5, and serves to mix the ruthenium raw gas and the oxygen-containing gas containing oxygen atoms (e.g., oxygen ($O_2$), ozone ($O_3$), etc.) with each other before these gases are supplied to the reaction chamber 1.

However, the conventional semiconductor manufacturing apparatus as described above has a deficiency in that it is extremely difficult to properly design of the shape or configuration of the gas mixing chamber 6. That is, in order to obtain a homogeneity or uniformity in the sheet resistance over the entire surface of the substrate, which is one of the characteristics required of semiconductor devices, it is necessary to configure the gas mixing space in the gas mixing chamber 6 into an optimal shape so as to permit the gases to easily mix with each other.

FIGS. 6($a$) and 6($b$) are views for explaining the shape of the gas mixing space in the gas mixing chamber 6. FIG. 6($a$) is a side view of the gas mixing chamber 6, illustrating the interior thereof in broken lines. In FIG. 6($a$), a diffuser 12 is arranged in the gas mixing chamber 6 so as to define gas mixing spaces 13 on the opposite sides thereof, i.e., on an upstream side and a downstream side thereof. FIG. 6($b$) is a plan view of the diffuser 12. The diffuser 12 has a plurality of holes 14 formed therethrough, so that the gases introduced into the gas mixing chamber 6 from the ruthenium raw gas feed pipe 4 and the oxygen-containing gas feed pipe 5 pass through the holes 14, thereby being diffused to mix with each other.

It is necessary to re-set the optimal shape of the gas mixing spaces 13 each time the film-forming conditions such as the film-forming pressure, the flow rates of the gases, etc., are changed, and hence in the past, the optimal shape of the gas mixing spaces 13 is determined upon change of the film-forming conditions by performing simulations of the mixing of the gases, evaluations of actual models using a lot of trial shapes or prototypes, thus resulting in high costs.

SUMMARY OF THE INVENTION

Accordingly, the object of the present invention is to provide a semiconductor manufacturing method and apparatus which is capable of producing a semiconductor device having required characteristics, such as one with excellent uniformity in the sheet resistance over the entire surface of a substrate, without requiring a careful or elaborate determination of an optimal shape or configuration of a gas mixing chamber or without the use of such a gas mixing chamber.

Bearing the above object in mind, according to one aspect of the present invention, there is provided a semiconductor manufacturing method comprising: mixing a ruthenium raw gas vaporized from a ruthenium liquid material and a gas containing oxygen atoms in piping at a location upstream of a reaction chamber; and forming a ruthenium film or a ruthenium oxide film on a substrate by using a gas mixture of the ruthenium raw gas and the gas containing oxygen atoms mixed with each other in the piping.

With this semiconductor manufacturing method, it is possible to mix the vaporized ruthenium raw gas and the gas containing oxygen atoms with each other to a satisfactory extent without the need for a careful or deliberate determination of an optimal shape or configuration of a gas mixing chamber or without the use of such a gas mixing chamber itself.

In a preferred form of the semiconductor manufacturing method of the present invention, after the ruthenium raw gas and the gas containing oxygen atoms having been mixed with each other in the piping, both of the ruthenium raw gas and the gas containing oxygen atoms are further mixed with each other in a gas mixing chamber which is provided at a location between the reaction chamber and a mixing place in which the ruthenium raw gas and the gas containing oxygen atoms are mixed with each other in the piping.

Thus, both of the ruthenium raw gas and the gas containing oxygen atoms are further mixed with each other in the gas mixing chamber so that the vaporized ruthenium raw gas and the gas containing oxygen atoms can be mixed well to a more satisfactory extent.

According to another aspect of the present invention, there is provided a semiconductor manufacturing apparatus comprising: a reaction chamber in which a ruthenium film or a ruthenium oxide film is formed on a substrate; a vessel for accommodating therein a ruthenium liquid material; a vaporizer connected to the vessel for vaporizing the ruthenium liquid material to provide a ruthenium raw gas; a ruthenium raw gas feed pipe connected with the vaporizer and the reaction chamber for supplying the vaporized ruthenium raw gas to the reaction chamber; and an oxygen-containing gas feed pipe connected with the reaction chamber for supplying a gas containing oxygen atoms to the reaction chamber. The ruthenium raw gas feed pipe and the oxygen-containing gas feed pipe are merged with each other at a location upstream of the reaction chamber so that the ruthenium raw gas and the gas containing oxygen atoms are mixed with each other prior to being supplied to the reaction chamber.

With this arrangement of the semiconductor manufacturing apparatus, since the ruthenium raw gas and the gas containing oxygen atoms are mixed well prior to being supplied to the reaction chamber, it becomes possible to provide semiconductor devices with required properties such as, for example, excellent uniformity in the sheet resistance over the entire surface of a substrate, without using a gas mixing chamber. In addition, the nonuse of such a gas mixing chamber leads to a further reduction in cost. Moreover, it becomes possible to lower the partial pressure of the liquescent ruthenium raw gas, so that the ruthenium raw gas is prevented from being liquefied again in the course of flowing from the vaporizer to the reaction chamber, thus making it possible to a stable supply of the ruthenium raw gas.

In a preferred form of the semiconductor manufacturing apparatus of the present invention, a gas mixing chamber is provided between the reaction chamber and a merged portion of the ruthenium raw gas feed pipe and the oxygen-containing gas feed pipe for further mixing the ruthenium raw gas and the gas containing oxygen atoms which have been mixed with each other in the merged portion, prior to being supplied to the reaction chamber.

With such an arrangement, since the ruthenium raw gas and the gas containing oxygen atoms are mixed well prior to entering the gas mixing chamber, it becomes possible to provide semiconductor devices with required properties such as, for example, excellent uniformity in the sheet resistance over the entire surface of a substrate, without the need of carefully or deliberately determining an optimal configuration or shape of the gas mixing chamber. Thus, a careful or deliberate determination of an optimal configuration or shape of the gas mixing chamber becomes unnecessary, thereby contributing to a cost reduction. In addition, the simplified configuration of the gas mixing chamber serves to lower the partial pressure of the liquescent ruthenium raw gas, thereby preventing the ruthenium raw gas from being liquefied again in the course of flowing from the vaporizer to the reaction chamber. As a result, it is possible to supply the ruthenium raw gas to the reaction chamber in a stable manner.

The above and other objects, features and advantages of the present invention will become more readily apparent from the following detailed description of preferred embodiments of the present invention taken in conjunction with the accompanying drawings.

DESCRIPTION OF THE PREFERRED EMBODIMENTS

Now, preferred embodiments of the present invention will be described in detail while referring to the accompanying drawings.

Embodiment 1

Figure 1:
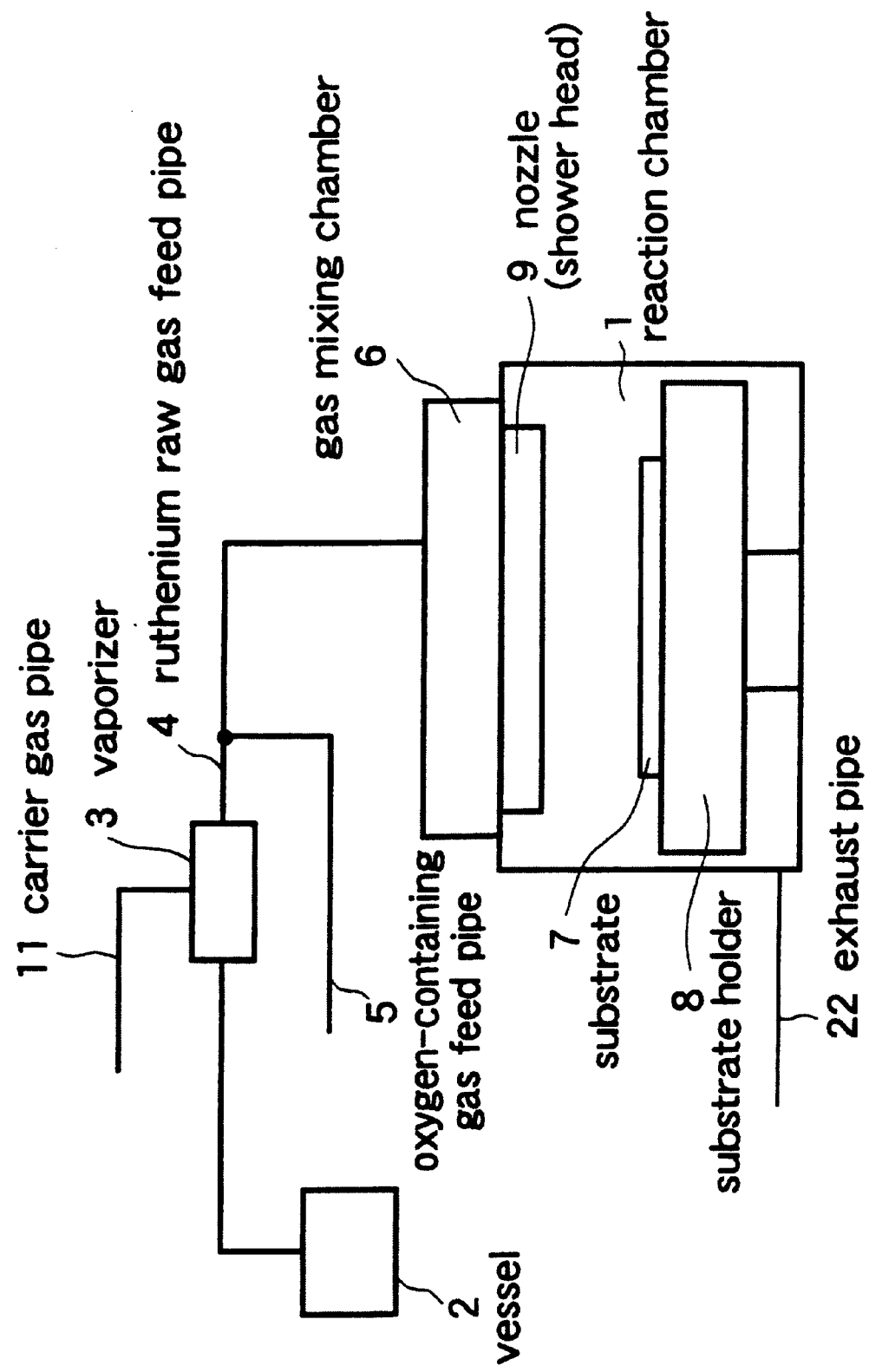
FIG. 1 is a view for explaining a semiconductor manufacturing apparatus according to one embodiment of the present invention.

FIG. 1 illustrates a semiconductor manufacturing apparatus according to one embodiment of the present invention. The semiconductor manufacturing apparatus illustrated in FIG. 1 includes, similar to the aforementioned conventional apparatus, a reaction chamber 1, a container or vessel 2 containing a ruthenium liquid material, a vaporizer 3 for vaporizing the ruthenium liquid material, a ruthenium raw gas feed pipe 4 for feeding a vaporized ruthenium raw gas to the reaction chamber 1, an oxygen-containing gas feed pipe 5 for feeding an oxygen-containing gas such as, for example, a gas containing oxygen atoms (e.g., oxygen ($O_2$), ozone ($O_3$), etc.) to the reaction chamber 1, a gas mixing chamber 6, and a carrier gas pipe 11 and an exhaust pipe 22. Also, in the reaction chamber 1, there are provided a substrate holder 8 with an unillustrated heating source or heater for supporting a substrate 7 thereon, and a nozzle or shower head 9 for jetting or spraying a mixture of the ruthenium raw gas and oxygen in a shower-like manner.

Nest, reference will be made to a method of depositing ruthenium films or ruthenium oxide films on a substrate by using the semiconductor manufacturing apparatus of the present invention. First of all, a substrate 7 is carried into the reaction chamber 1, disposed on the substrate holder 8, and then heated to a prescribed processing temperature by means of the unillustrated heater of the substrate holder 8. Subsequently, a ruthenium raw gas is supplied to the reaction chamber 1 from the ruthenium raw gas feed pipe 4, and an oxygen-containing gas is supplied to the reaction chamber 1 from the oxygen-containing gas feed pipe 5. In this case, the ruthenium raw gas and the oxygen-containing gas are mixed in the piping, and both gases thus mixed are supplied onto the substrate 7 by way of the gas mixing chamber 6 and the shower head 9, so that the oxygen in the oxygen-containing gas chemically reacts with the ruthenium raw gas to deposit or form a ruthenium film or a ruthenium oxide film on the substrate 7. Thereafter, the supplies of the ruthenium raw gas and the oxygen-containing gas are stopped, and the interior of the reaction chamber 1 is purged by an inert gas such as a nitrogen ($N_2$) gas to remove the residual gas therefrom. Then, the substrate 7 having been processed is taken out of the reaction chamber 1.

According to one embodiment of the present invention, the ruthenium raw gas feed pipe 4 and the oxygen-containing gas feed pipe 5 are joined or merged with each other at a location upstream of the gas mixing chamber 6. As a result, the ruthenium raw gas and the oxygen-containing gas (e.g., a gas containing oxygen ($O_2$), ozone ($O_3$), etc.) are mixed with each other to a satisfactory extent before they enter the gas mixing chamber 6. Here, note that the place of the merging of the ruthenium raw gas feed pipe 4 and the oxygen-containing gas feed pipe 5 is not specifically limited so long as their connection must be effected at a location upstream of the gas mixing chamber 6. It is presumed that the reason for the gases being sufficiently mixed with each other before entering the gas mixing chamber 6 with such a simple construction that the ruthenium raw gas feed pipe 4 and the oxygen-containing gas feed pipe 5 are joined or merged with each other at a location upstream of the gas mixing chamber 6 is due to turbulence generated when these gases merge together in the piping. This effect is confirmed only in the case of using the ruthenium raw gas and the gas containing oxygen atoms, but such an effect is not obtained when a raw gas other than the ruthenium raw gas is used, or when a gas other than the oxygen-containing gas which contains oxygen atoms is used as a reactive gas. Moreover, according to the present invention, the use of the ruthenium liquid material serves to suppress the generation of particles, thus further improving the uniformity in the sheet resistance over the entire surface of a substrate.

Here, it is to be noted that in the commonsense view of those skilled in the art, for example, as disclosed in Japanese Patent Laid-Open No. 2000-58529, it has been considered that the merging or connection of the ruthenium raw gas feed pipe 4 and the oxygen-containing gas feed pipe 5 at a location upstream of the gas mixing chamber 6 would cause the ruthenium raw material and the gas containing oxygen atoms to react with each other, thereby generating clogging in the piping (see paragraph No. 0022 in the Japanese reference). Therefore, in the prior art, a ruthenium raw gas vaporized from a ruthenium liquid material $Ru(C_5H_4C_2H_5)_2$ and a gas containing oxygen atoms are supplied to the reaction chamber by way of separate and independent pipes, respectively. However, as a result of elaborate and assiduous studies and considerations, the inventors found that the above-mentioned problem did not arise even by introducing the ruthenium raw gas and the oxygen-containing gas into a single piping at the same time under a special condition contemplated by the inventors, thus completing the present invention.

The ruthenium liquid material used in the present invention is not particularly limited, but a typical one is $Ru(C_5H_4C_2H_5)_2$, for example.

In addition, the ratio of the flow rate of the ruthenium raw gas to the flow rate of the gas containing oxygen atoms (i.e., oxygen ($O_2$), ozone ($O_3$), etc.) is not particularly limited but can be properly determined according to the kind of the films (i.e., ruthenium films or ruthenium oxide films) formed on a substrate. Also, the carrier gas, being caused to flow through the carrier gas pipe 11 for transportation of the ruthenium raw gas, can be properly selected from known ones, and for instance, an inert gas such as a nitrogen ($N_2$) gas, an argon (Ar) gas or the like may be used for such a purpose.

Embodiment 2

Figure 2:
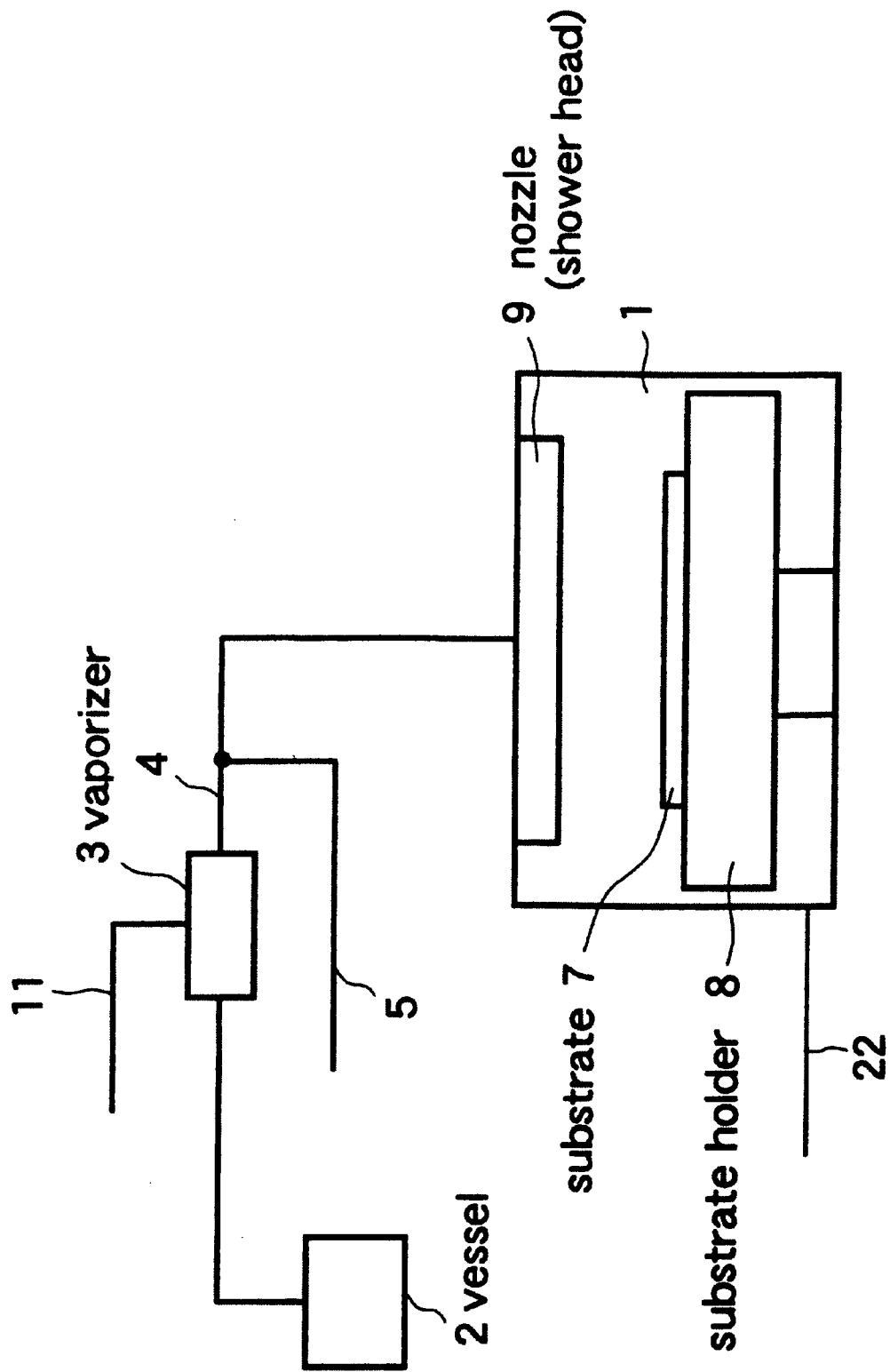
FIG. 2 is a view for explaining a semiconductor manufacturing apparatus according to another embodiment of the present invention.

FIG. 2 illustrates a semiconductor manufacturing apparatus according to another embodiment of the present invention. The semiconductor manufacturing apparatus of FIG. 2 is substantially similar in construction to that of FIG. 1 except the fact that the gas mixing chamber 6 of FIG. 1 is omitted.

In this embodiment, the ruthenium raw gas feed pipe 4 and the oxygen-containing gas feed pipe 5 are joined or merged together at a location upstream of the reaction chamber 1. As a result, the ruthenium raw gas and the gas containing oxygen atoms (i.e., oxygen ($O_2$), ozone ($O_3$), etc.) are sufficiently mixed with each other before being supplied to the reaction chamber 1. In this regard, the place of the connection of the ruthenium raw gas feed pipe 4 and the oxygen-containing gas feed pipe 5 is not limited though their connection must be upstream of the reaction chamber 1. It is also presumed that the reason for the gases being sufficiently mixed with each other before entering the reaction chamber 1 even with such a simple construction that the ruthenium raw gas feed pipe 4 and the oxygen-containing gas feed pipe 5 are joined or merged together at a location upstream of the reaction chamber 1 is due to turbulence generated when these gases merge together in the piping, as described with reference to the aforementioned first embodiment. Similarly, this effect is confirmed only in the case of using the ruthenium raw gas and the gas containing oxygen atoms, but such an effect is not obtained when a raw gas other than the ruthenium raw gas is used, or when a gas other than the gas containing oxygen atoms is used as a reactive gas.

In this embodiment, too, as in the first mentioned embodiment, the ruthenium raw material, the ratio of the flow rate of the ruthenium raw gas to the flow rate of the gas containing oxygen atoms (i.e., oxygen ($O_2$), ozone ($O_3$), etc.), and the carrier gas are not particularly limited but can be properly selected as required.

Embodiment 3

As described above, according to the present invention, the ruthenium raw gas and the gas containing oxygen atoms are mixed with each other to a satisfactory extent in the piping upstream of the reaction chamber, so that a film-forming apparatus such as, for example, a BST ((Ba, Sr)$TiO_3$) film fabrication apparatus, which is not generally suited to and used for the formation of ruthenium films or ruthenium oxide films, can be utilized for forming such ruthenium films or ruthenium oxide films while using its gas mixing chamber for that purpose without any changes or alterations.

Figure 3:
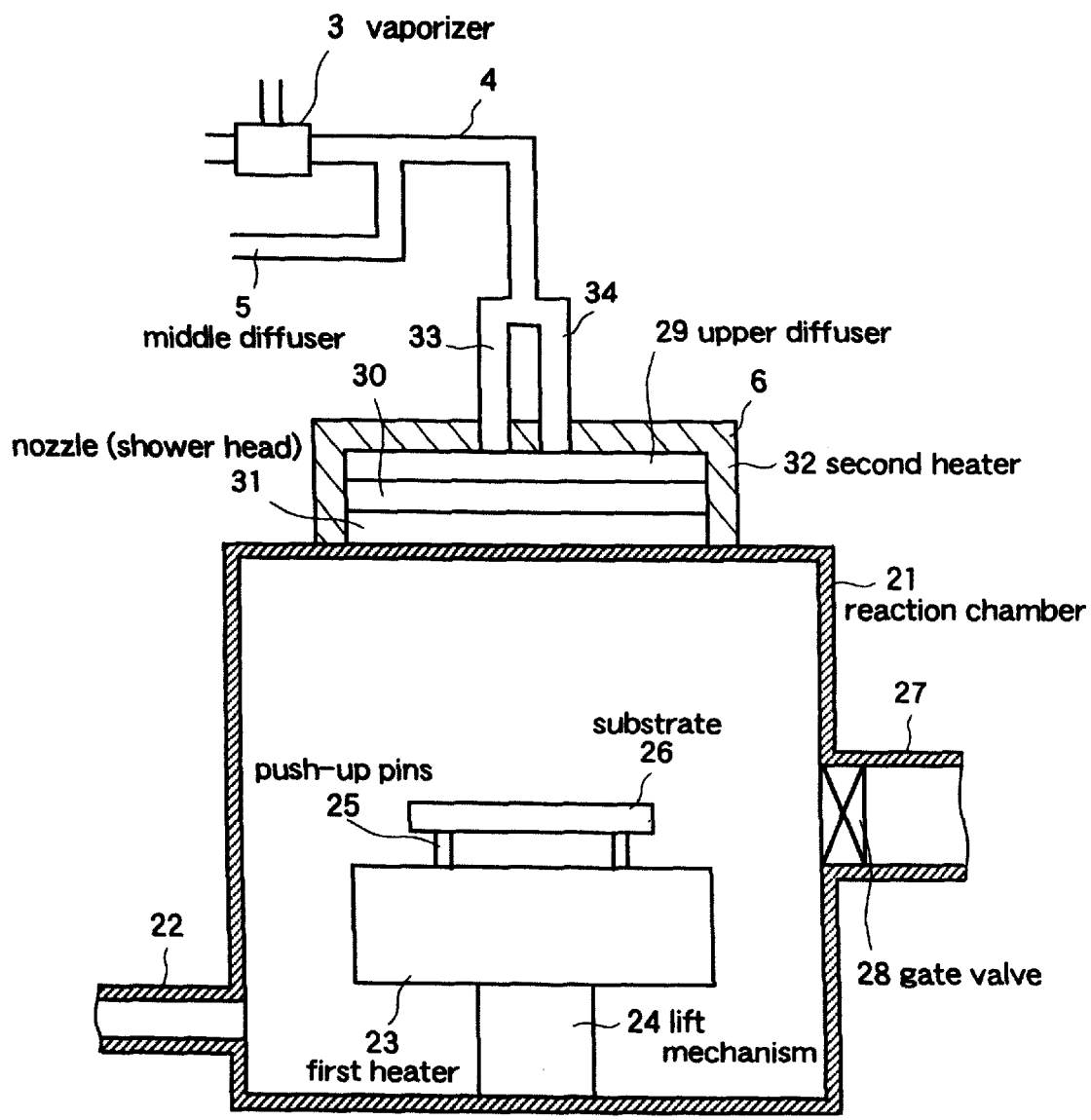
FIG. 3 is a view for explaining an apparatus for fabricating BST films according to a further embodiment of the present invention.

FIG. 3 illustrates such a BST film fabrication apparatus which utilizes its gas mixing chamber for the formation of ruthenium films or ruthenium oxide films without any changes, according to a third embodiment of the present invention. As illustrated in FIG. 3, an exhaust pipe 22 is connected with a reaction chamber 21 which is in turn connected with an evacuation device (not shown). Also, the reaction chamber 21 is provided with a substrate introduction port 27 with a gate valve 28 installed therein. When the gate valve 28 is opened, a substrate 26 is introduced into the reaction chamber 21 through the substrate introduction port 27. A heater 23, corresponding to the substrate holder 8 of the first and second embodiments, is provided in the reaction chamber 21. The heater 23 is driven to move in a vertical direction by means of a lift mechanism 24. A plurality of push-up pins 25 are mounted on the heater 23 for vertical movement relative thereto, so that the substrate 26 is placed on and supported by the push-up pins 25 when introduced into or taken out of the reaction chamber 21. Here, note that upon forming thin films on the substrate 26, the heater 23 with the substrate 26 supported thereon is driven to move in an upward direction to a prescribed film-forming position under the action of the lift mechanism 24. At this time, the push-up pins 25 are retracted to be received in the heater 23, so that the substrate 26 is placed on the heater 23.

A shower head 31 is installed on the top of the reaction chamber 21, and a first or middle diffuser 30 is mounted on the shower head 31 with a second or upper diffuser 29 being in turn installed on the middle diffuser 30. The upper diffuser 29 and the middle diffuser 30 together constitute the gas mixing chamber 6 which in turn cooperates with the shower head 31 to constitute a gas supply system. In addition, a second heater 32 is mounted on the top of the reaction chamber 21 so as to cover the gas supply system. Here, it is to be noted that the construction of the BST film fabrication apparatus other than the above is substantially similar to that of the semiconductor manufacturing apparatus of the above-mentioned first embodiment; in particular, the ruthenium raw gas feed pipe 4 and the oxygen-containing gas feed pipes 5 are joined or merged together at a location upstream of the gas mixing chamber 6. Thus, both of the ruthenium raw gas from the ruthenium raw gas feed pipe 4 and the gas containing oxygen atoms from the oxygen-containing gas feed pipes 5 are mixed with each other and then sent to the gas mixing chamber 6 by way of pipes 33 and 34 which extend through the second heater 32 into the upper diffuser 29. In this regard, note that the piping 33 corresponds to piping for supplying a raw gas mixture vaporized from a Ba raw material, a Sr raw material and a Ti raw material when BST films are formed, and the piping 34 corresponds to piping for supplying an oxygen-containing gas when BST films are formed.

Figure 7:
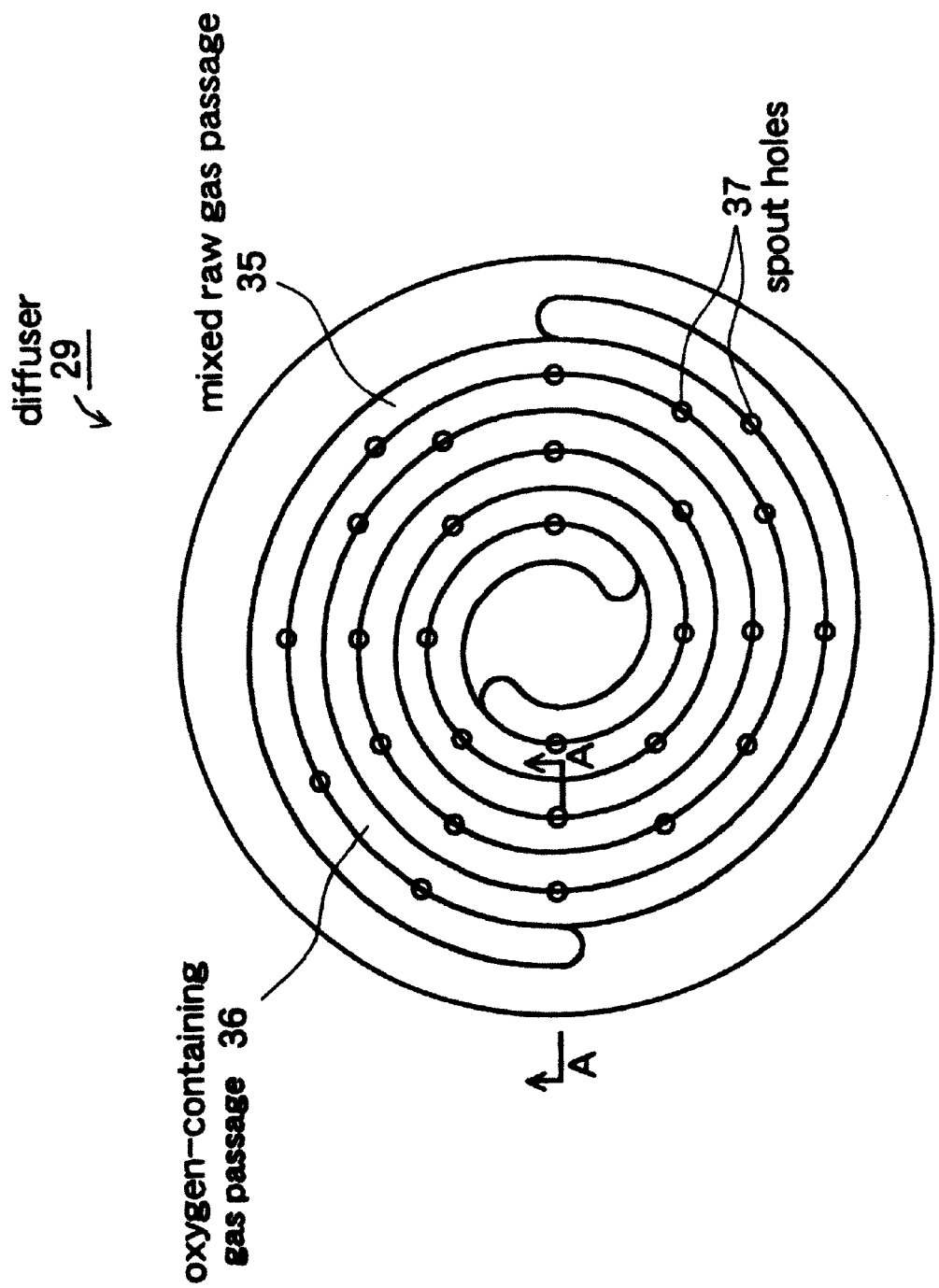
FIG. 7 is a view illustrating a diffuser of the semiconductor manufacturing apparatus shown in FIG. 3.
Figure 8:
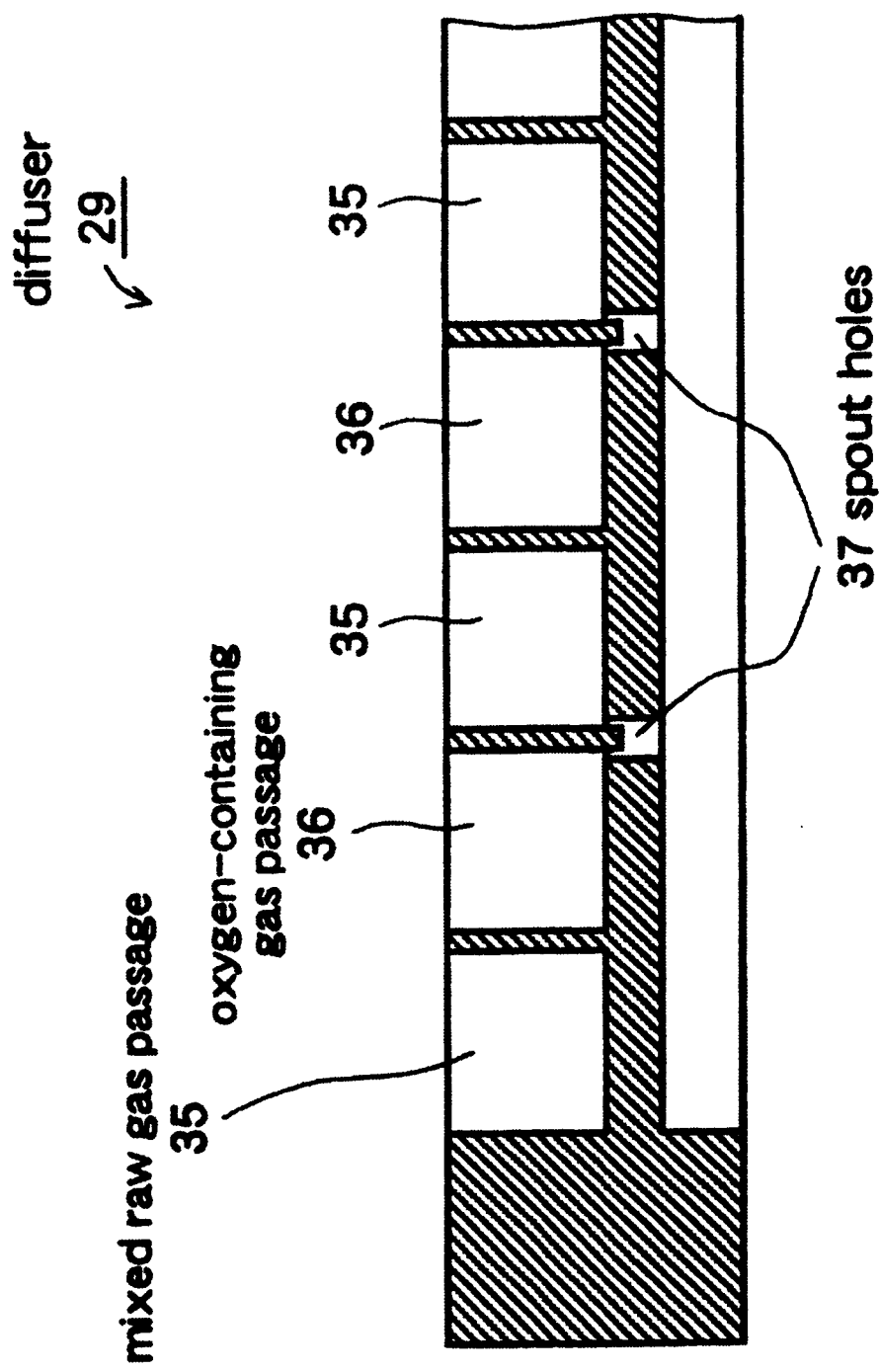
FIG. 8 is a cross sectional view taken along line A—A of FIG. 7.

The internal structure of the gas mixing chamber 6 is not particularly limited but one example thereof will be described below. FIG. 7 illustrates the diffuser of the semiconductor manufacturing apparatus shown in FIG. 3, and FIG. 8 is a cross section taken along line A—A in FIG. 7. The upper diffuser 29 is provided with a spiral-shaped first mixed gas passage 35, connected with the piping 35, and a spiral-shaped second mixed gas passage 36, connected with the piping 34, for guiding a gas mixture comprising a ruthenium raw gas and a gas containing oxygen atoms along a horizontal surface. The first and second mixed gas passages 35, 36 are arranged side by side and are formed with a plurality of spout holes 37 for fluidic communication with each other. In addition, the middle diffuser 30 is formed with a plurality of throughholes at locations not corresponding to the spout holes 37 in the first and second mixed gas passages 35, 36. Also, the shower head 11 is provided with a lot of throughholes with a large ratio of its lengthwise dimension to its diametrical dimension. The upper diffuser 29 serves to diffuse the gas mixture of the ruthenium raw gas and the gas containing oxygen atoms in a horizontal direction to flow down, and the middle diffuser 30 functions to further diffuse the gas mixture that has been diffused by the upper diffuser 29. The shower head 29 acts to supply or spray the gas mixture of the gas mixture of the ruthenium raw gas and the gas containing oxygen atoms to the substrate 26 in the reaction chamber 1 in a shower-like manner, whereby ruthenium films or ruthenium oxide films are formed on the substrate 26 in the form of a semiconductor wafer. Here, note that the shape of the above-mentioned diffusers 29, 30 is only one example, and is not limited to such a shape.

Embodiment 4

Figure 4:
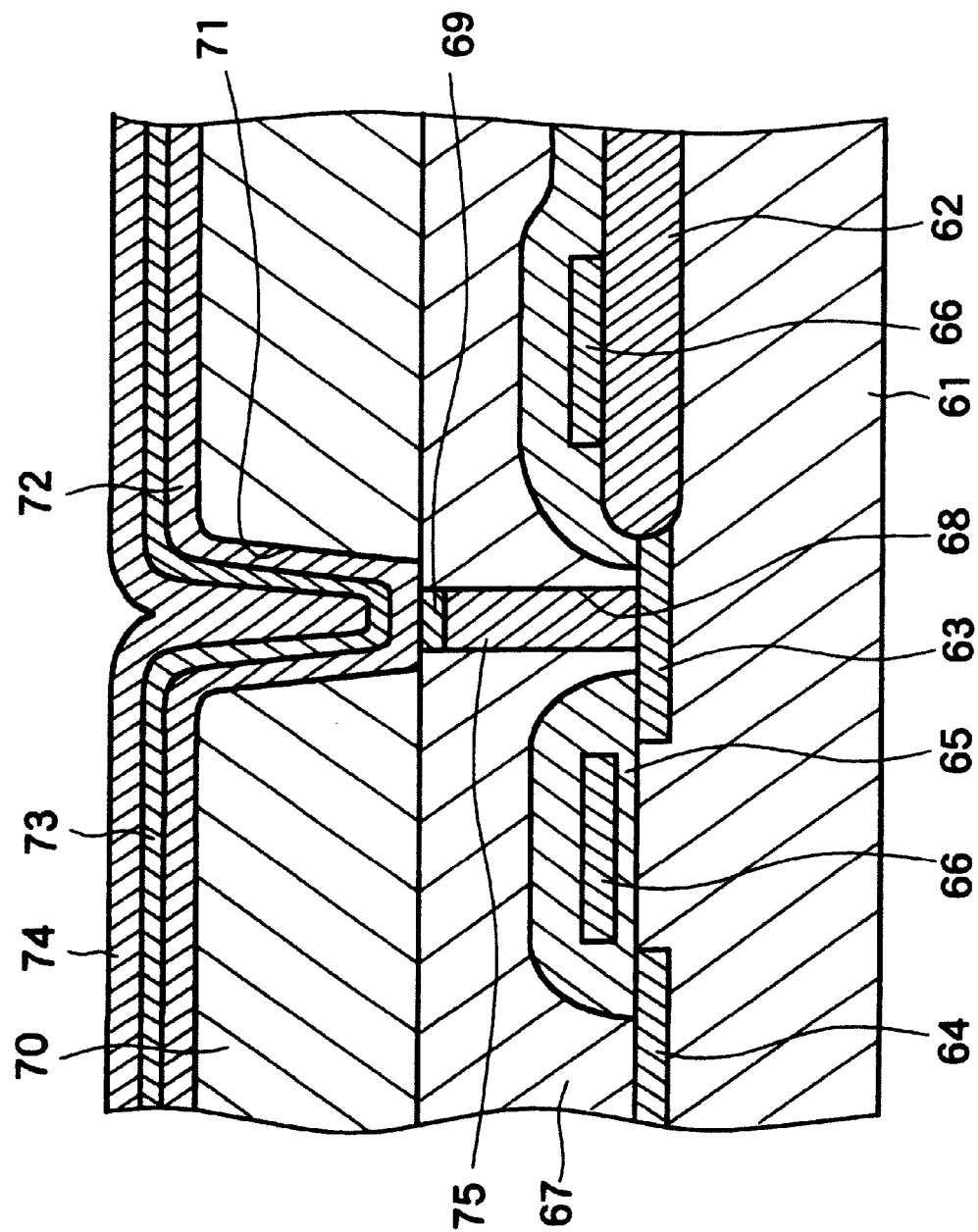
FIG. 4 is a cross sectional view illustrating a part of a DRAM which includes ruthenium films or ruthenium oxide films formed by using a semiconductor manufacturing method of the present invention.
Figure 5:
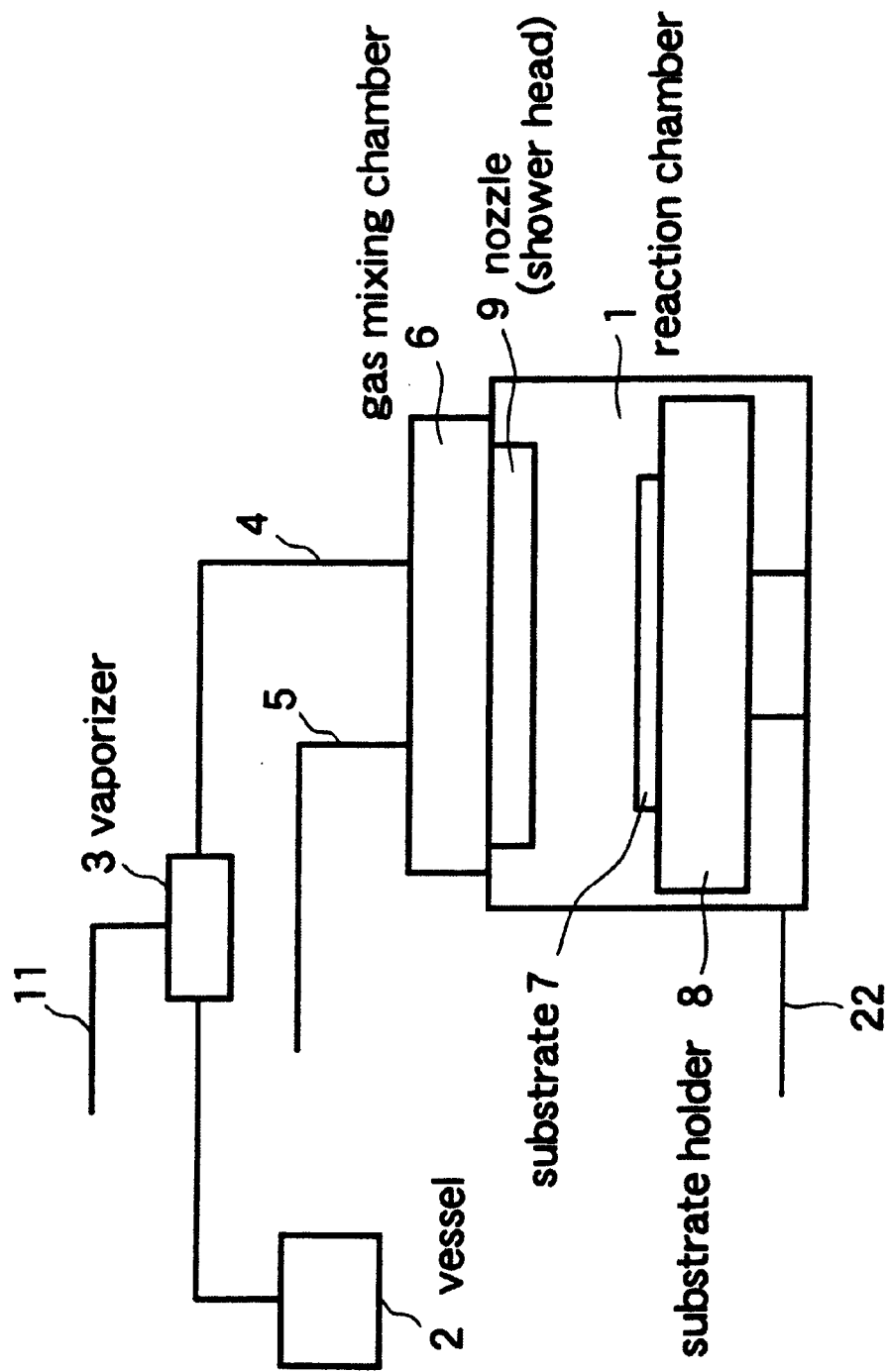
FIG. 5 is a view for explaining one example of a conventional semiconductor manufacturing apparatus.
Figure 6A:
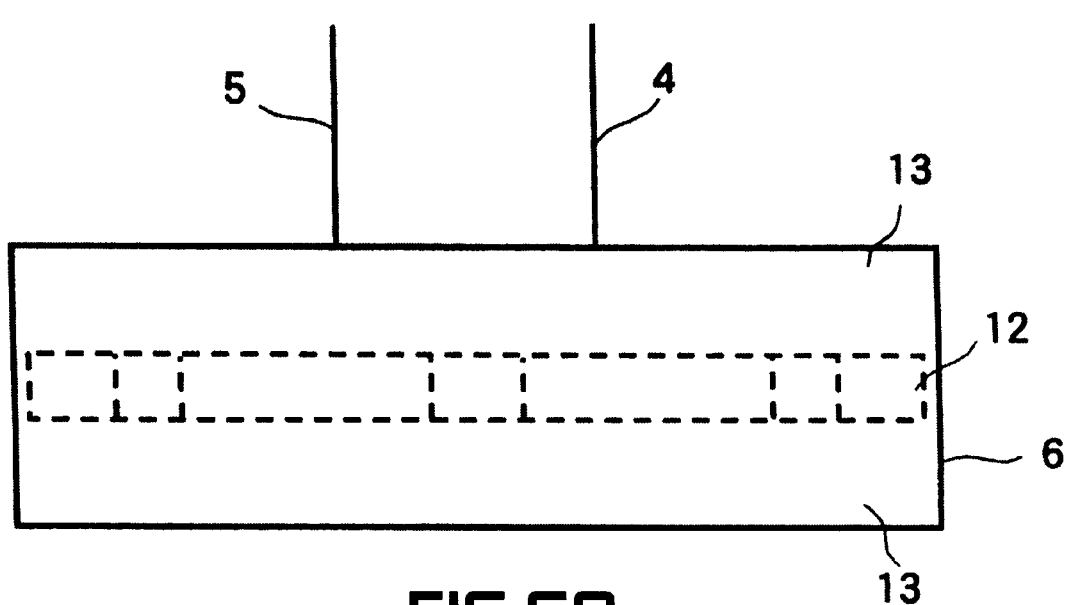
FIGS. 6A and 6B are views for explaining the shape of gas mixing spaces in a gas mixing chamber.
Figure 6B:
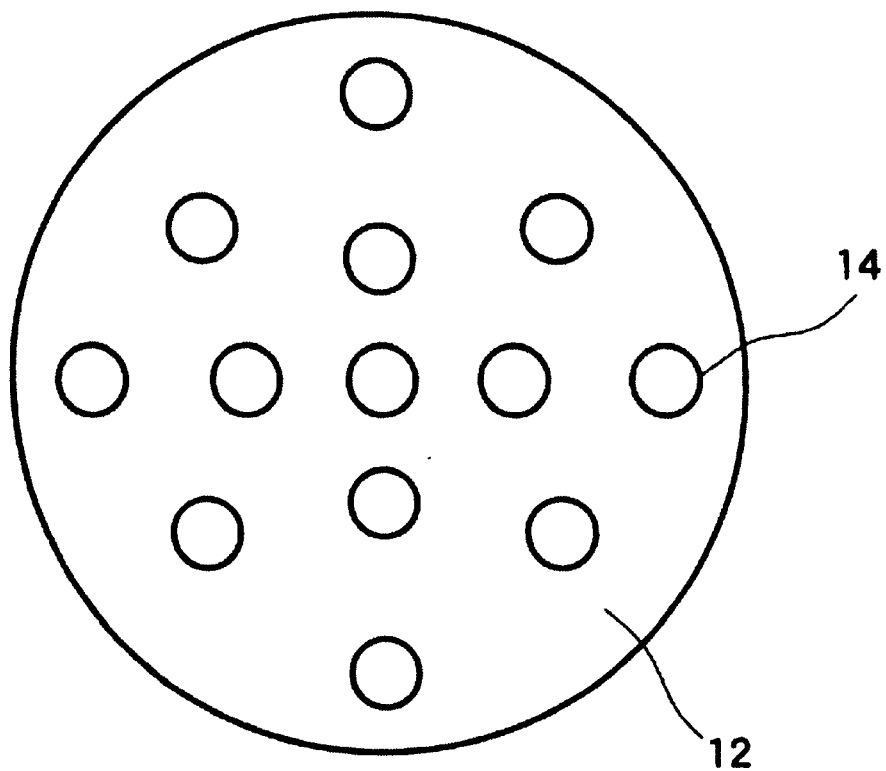

FIG. 4 is a cross sectional view illustrating a part of a DRAM which includes ruthenium films or ruthenium oxide films formed by using the manufacturing method of the present invention.

As shown in FIG. 4, on a surface of a silicon substrate 61, there are formed field oxide films 62 for forming a multitude of transistor-forming regions in a mutually separated manner. Also, on the surface of the silicon substrate 61, there are formed source electrodes 63 and drain electrodes 64 with gate electrodes 66 acting as word lines being disposed therebetween via gate insulation films 65, respectively, on which a first interlayer insulation film 67 is provided. Contact holes 68 are formed through the first interlayer insulation film 67, and a barrier metal 69 and a plug electrode 75 connected to a corresponding one of the source electrodes 63 are formed in each of the contact holes 68. On the first interlayer insulation film 67, there is formed a second interlayer insulation film 70 through which contact holes 71 are formed. On the second interlayer insulation film 70 and in the contact holes 71, there is provided a capacitance lower electrode 72 which is made of ruthenium and connected with the barrier metals 69. Formed on the capacitance lower electrode 72 is a capacitance insulation film 73 made of $Ta_2O_5$ on which is formed a capacitance upper electrode 74 made of ruthenium, titanium nitride, or the like. That is, with this DRAM, a capacitor cell is connected with the source electrode 63 of a MOS transistor.

Next, reference will be had to a method of manufacturing the DRAM illustrated in FIG. 4. First, a field oxide film 62 is formed in the surroundings of each transistor-forming region on the surface of the silicon substrate 61 by means of a LOCOS process. Subsequently, a gate electrode 66 is formed in each transistor-forming region through a corresponding gate insulation layer 65. Thereafter, impurities are introduced into the surface of the silicon substrate 61 by ion-implantation using the field oxide film 62 and the gate electrode 66 as masks, thus forming the source electrode 63 and the drain electrode 64 in a self-aligned manner. After each gate electrode 66 is covered with an insulating film, the first interlayer insulation film 67 is formed on the substrate 61. Then, each contact hole 68 through which a corresponding source electrode 63 is exposed is formed through the first interlayer insulation film 67, and the plug electrode 75 and the barrier metal 79 are formed in each contact hole 68. Subsequently, the second interlayer insulation film 70 is formed on the first interlayer insulation film 67, and the contact holes 71 are formed through the interlayer insulation film 70 so as to expose the corresponding barrier metals 69, respectively. Thereafter, a ruthenium film or a ruthenium oxide film is deposited on the interlayer insulation film 70 and in the contact holes 71 by means of the semiconductor manufacturing method of the present invention, and patterning is effected to provide the capacitance lower electrode 72. The capacitance insulation film 73 made of $Ta_2O_5$ is then formed on the capacitance lower electrode 72, and the capacitance upper electrode 74 made of ruthenium, titanium nitride, etc., is in turn formed on the capacitance insulation film 73.

As described above, according to the present invention, a semiconductor manufacturing method and apparatus can be provided which is capable of obtaining semiconductor devices with required properties such as, for example, excellent uniformity in the sheet resistance over the entire surface of a substrate, without the need of carefully or deliberately determining an optimal configuration of a gas mixing chamber, or without the use of such a gas mixing chamber itself.

While the invention has been described in terms of preferred embodiments, those skilled in the art will recognize that the invention can be practiced with modification within the spirit and scope of the appended claims.

What is claimed is:

1. A semiconductor manufacturing method comprising:
    mixing a ruthenium raw gas vaporized from a ruthenium liquid material by using a vaporizer and a gas containing oxygen atoms in piping at a location between said vaporizer and a reaction chamber to obtain a gas mixture;
    supplying said gas mixture into said reaction chamber; and
    forming a ruthenium film or a ruthenium oxide film on a substrate by using said gas mixture in said reaction chamber, wherein said ruthenium liquid material is $Ru(C_5H_4C_2H_5)_2$.

2. The method of claim 1, wherein said gas mixture is supplied onto said substrate with a shower head.

3. The method of claim 1, wherein said gas containing oxygen atoms is one of $O_2$ or $O_3$.

4. A semiconductor manufacturing method comprising:

mixing a ruthenium raw gas vaporized from a ruthenium liquid material by using a vaporizer and a gas containing oxygen atoms in piping at a location between said vaporizer and a reaction chamber to obtain a gas mixture;

supplying said gas mixture into said reaction chamber; and forming a ruthenium film or a ruthenium oxide film on a substrate by using said gas mixture in said reaction chamber;

after said ruthenium raw gas and said gas containing oxygen atoms having been mixed with each other in said piping to obtain said gas mixture, further mixing said gas mixture in a gas mixing chamber which is provided at a location between said reaction chamber and a mixing place in which said ruthenium raw gas and said gas containing oxygen atoms are mixed with each other in said piping to obtain a gas mixture; and supplying said gas mixture into said reaction chamber, wherein said ruthenium liquid material is $Ru(C_5H_4C_2H_5)_2$.

5. The method of claim 4, wherein said gas mixture is supplied onto said substrate with a shower head.

6. The method of claim 4, wherein said gas containing oxygen atoms is one of $O_2$ or $O_3$.

7. A semiconductor manufacturing method comprising:

mixing a ruthenium raw gas vaporized from $Ru(C_5H_4C_2H_5)_2$ and a gas containing oxygen atoms in piping to obtain a gas mixture;

supplying said gas mixture into a reaction chamber; and forming one of a ruthenium film and a ruthenium oxide film on a substrate using said gas mixture in said reaction chamber.

* * * * *